United States Patent [19]

Neugebauer et al.

[11] Patent Number: 4,901,136
[45] Date of Patent: Feb. 13, 1990

[54] MULTI-CHIP INTERCONNECTION PACKAGE

[75] Inventors: Constantine A. Neugebauer; Lionel M. Levinson, both of Schenectady; Homer H. Glascock, II, Scotia; Charles W. Eichelberger, Schenectady; Robert J. Wojnarowski, Ballston Lake; Richard O. Carlson, Scotia, all of N.Y.

[73] Assignee: General Electric Company, Schenectady, N.Y.

[21] Appl. No.: 285,363

[22] Filed: Dec. 15, 1988

Related U.S. Application Data

[63] Continuation of Ser. No. 73,136, Jul. 14, 1987, Pat. No. 4,783,695.

[51] Int. Cl.⁴ ............... H01L 23/16; H01L 23/48; H01L 23/02
[52] U.S. Cl. .................................. 357/75; 357/54; 357/55; 357/70; 357/73; 357/74; 357/80
[58] Field of Search ............ 357/75, 70, 73, 74, 357/54, 55, 80

[56] References Cited

U.S. PATENT DOCUMENTS

| | | | |
|---|---|---|---|
| 4,021,838 | 5/1977 | Warwick | 357/75 |
| 4,026,008 | 5/1977 | Drees et al. | 357/70 |
| 4,074,342 | 2/1978 | Honn et al. | 357/75 |
| 4,202,007 | 5/1980 | Dougherty et al. | 357/70 |
| 4,265,512 | 5/1981 | Chiron et al. | 357/75 |
| 4,322,778 | 3/1982 | Barbour et al. | 357/74 |
| 4,541,035 | 9/1985 | Carlson et al. | 361/414 |
| 4,617,586 | 10/1986 | Cuvilliers et al. | 357/75 |
| 4,667,219 | 5/1987 | Lee et al. | 357/74 |
| 4,739,389 | 4/1988 | Goedbloed | 357/74 |
| 4,809,058 | 2/1989 | Funamoto et al. | 357/74 |

FOREIGN PATENT DOCUMENTS

| | | | |
|---|---|---|---|
| 59-23531 | 2/1984 | Japan | 357/75 |
| 59-117250 | 7/1984 | Japan | 357/75 |
| 61-27667 | 2/1986 | Japan | 357/75 |

OTHER PUBLICATIONS

C. J. Bartlett et al., "Multi-Chip Packaging Design for VLSI-Based Systems", *Proceedings of the 37th Electronic Components Conference, May 11-13, 1987, Boston, Mass., pp. 518-525.*

Archey et al., "Integrated Magnetic Memory Structure", IBM Technical Disclosure Bulletin, vol. 14, No. 7, Dec. 1971.

*Primary Examiner*—Andrew J. James
*Assistant Examiner*—Ngan Van Ngo
*Attorney, Agent, or Firm*—Marvin Snyder; James C. Davis, Jr.

[57] ABSTRACT

A package for interconnecting a plurality of integrated circuit chips into a functional unit comprising a multilayer substrate having ground and power conducting layers and a frame for holding the chips with their terminal pads on the side of the frame opposite the substrate. Power and ground terminal pads on the chips are coupled to the appropriate potentials via registering conductive feedthroughs passing through the frame and into the substrate into contact with appropriate power or conductive layers in the substrate. Signal pads on the chips are interconnected by means of a conductive layer which is located over the chips on the side of the frame opposite the substrate.

15 Claims, 2 Drawing Sheets

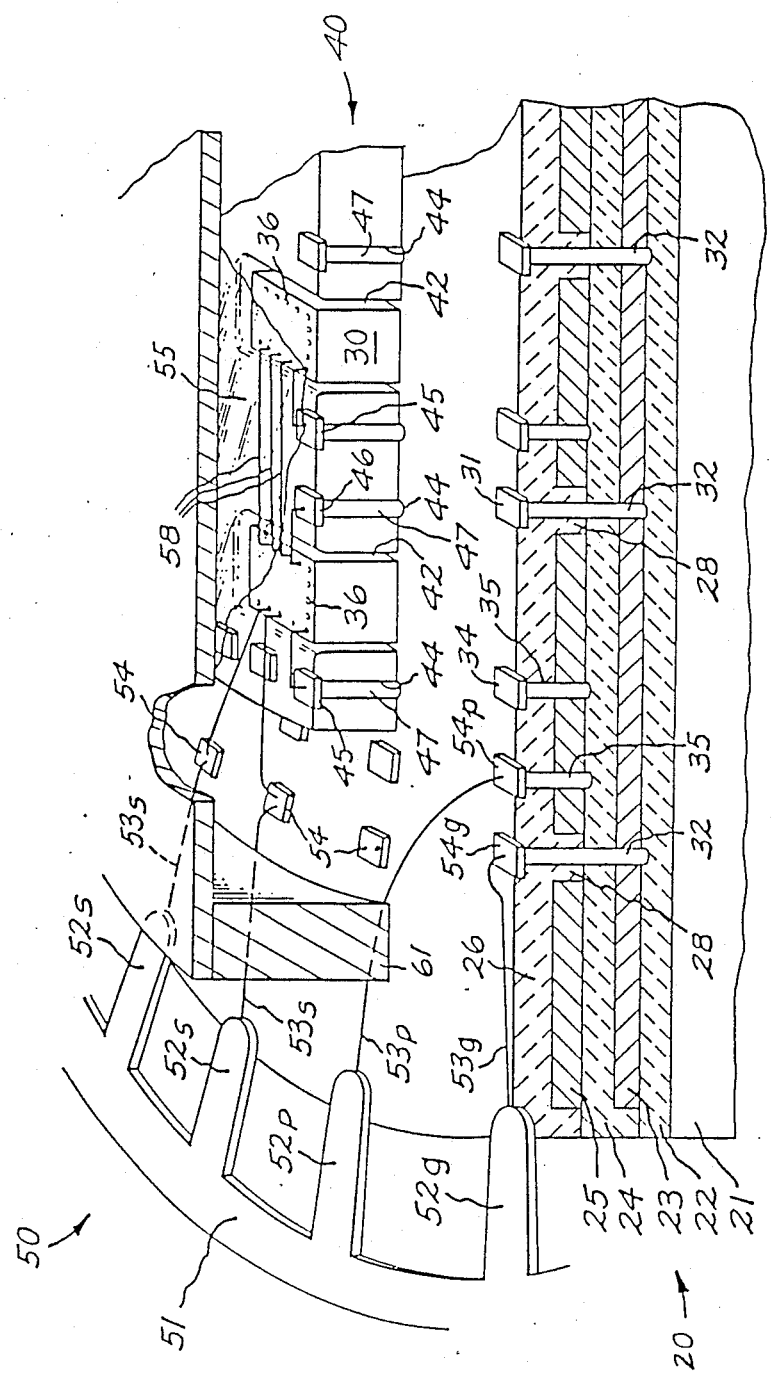

MULTI-CHIP INTERCONNECTION PACKAGE

This application is a continuation of application Ser. No. 073,136 filed July 14, 1987, now abandoned.

The disclosed invention relates generally to a packaging system for integrated circuit chips containing electronic devices connected in functional circuits and, more specifically, to a high performance superdensity enclosure for interconnecting and packaging a plurality of VLSI chips in a functional relationship. The disclosed packaging system provides enhanced overall miniaturization of the chip package and minimizes the lengths of chip interconnections.

BACKGROUND OF THE INVENTION

Chip oriented technologies are playing an ever increasing role in product innovation and improvement. While chip complexity is approaching the 1 megabit milestone, products often require more capabilities than can be adequately incorporated in a single chip. Moreover, it is often preferred, particularly in the case of extensive large scale systems such as super computers, that the system not be over-integrated to avoid the possibility that an entire expensive assembly may have to be scrapped because of the failure of a relatively minor part. Accordingly, it is becoming increasingly common for chip oriented technologies to be implemented as chip sets comprising a plurality of individual chips designed to be interconnected and to interact in a pre-specified manner. A typical chip set might, for example, include chips which provide a microprocessor, one or more interface chips, a permanent memory such as a read only memory (ROM), and a volatile storage such as a random access memory (RAM). While chip sets can contain as few as two or three chips, chip sets for computers typically contain several hundred or even thousands of chips. VLSI chips in a set may typically include up to 64 or more external connections and the majority of these connections are directed to interfacing with other chips.

One of the difficulties in using a large set of chips, however, is the fact that the various chips must communicate with one another. Each chip in the set must have sources of power and ground potentials, and the conductive elements which provide the power and ground connections sized appropriately to handle the required current for the package and must be well insulated from each other, especially where chip voltages are relatively high. In addition, the chips in the set must communicate with each other which usually entails a rather complex interconnection scheme.

Information processing equipment such as computers or other signal processors employ chip sets containing hundreds or thousands of chips. The cost of these systems directly relate to the cost of packaging and interconnecting the chips in a set in a desired functional relationship. Further, the operating speed of a system and the chips comprising the system play an important role in the successful implementation of new technologies. Interconnections between chips contribute to signal propagation delay and signal distortion. In addition, the packaging system must be capable of dissipating as much heat as it generates in order to maintain thermal equilibrium. Conventional packaging systems employing printed circuit boards are unable to handle the required number of chips within a volume and at a density which is readily compatible with the requirements of more advanced circuit applications. Moreover, chips disposed on an exposed substrate are susceptible to contamination.

This invention is directed to a package for holding and interconnecting a plurality of chips into an operational unit. The package is intended to provide a contamination free environment, connection runs of minimum length, and a thermally stable containment for the chips.

A silicon circuit board which incorporates multiple levels of patterned conductors similar to that employed in the disclosed invention is described in U.S. Pat. No. 4,541,035 issued to R. O. Carlson, H. H. Glascock, J. A. Loughran, and H. F. Webster, for a Low Loss Multilevel Silicon Circuit Board. The substrate interconnection arrangement of this invention bears some resemblance to the interconnecting board described in the above referenced patent.

U.S. patent application Ser. number 912,456, filed Sept. 26, 1986 now U.S. Pat. No. 4,783,695, issued Nov. 8, 1988, in the names of Robert J. Wojnarowski and Charles W. Eichelberger, entitled "Multichip Integrated Circuit Packaging Configuration and Method" also discloses an interconnection technique relevant to that utilized as part of the invention herein, which application is assigned to the same assignee as the instant application, said application being incorporated herein by reference.

OBJECTS OF THE INVENTION

Accordingly, it is a principal object of the invention to provide a packaging system for mounting and functionally interconnecting a large set of integrated circuit chips to establish a functional component of a larger device.

A further object is to provide a hybrid packaging system for chips which minimizes the length of interconnections between the packaged chips and also minimizes the exterior dimension of the overall package, thereby reducing signal propagation delays.

A further object of the present invention is to provide a hybrid packaging system for VLSI chips which provides a low signal loss, low propagation signal delay, low cross talk, and low power dissipation interconnect mechanism to allow a plurality of chips to efficiently communicate with each other at very high clock rates.

A yet further object of the present invention is to provide for a cost effective system for packaging a plurality of chips.

A still further object of the invention is to provide an improved hybrid packaging system for VLSI chips in which a plurality of chips can be assembled in a closely packed functional relationship.

It is a further object to provide a packaging system in which the heat generated by the package is dissipated in order to maintain thermal equilibrium and in which thermal coefficients of expansion of the various components of the package are closely matched by making the package substantially of silicon material.

It is a further object of the present invention to provide for hermeticity in a superdense high performance package system in which the chips are disposed according to a prespecified placement hierarchy in a closely spaced relationship and the lengths of the chip interconnections are minimized.

It is a further object of the invention to provide a superdensity hermetic high performance packaging system for VLSI chips which exhibits improved miniaturization.

SUMMARY OF THE INVENTION

These and other objects of the invention are achieved in a chip-holding and interconnection package which, in its preferred form, includes a cylindrically shaped chip-holding frame having a plurality of conducting feedthroughs for coupling power and ground potentials to the chips. The chips are mounted in wells or recesses in the frame in a manner that locates the terminal pads of the chips substantially flush with a major surface of the frame and on the same level as the power and ground terminations of the above noted conducting feedthroughs. The frame is attached to a cylindrically shaped substrate having a diameter greater than that of the frame and including multiple conductor layers adapted for coupling ground and power potentials into the package. The conductor layers are separated by an insulating layer and are all carried on an insulating silicon wafer. A cover is supported on a peripheral band of the substrate and overlies the frame to thereby form a hermetically sealed enclosure for the chips. Power and ground connections are brought into the package by way of a circularly shaped lead frame sandwiched between the cover and the substrate. Substantially all of the materials making up the package are made of thermally matched silicon.

BRIEF DESCRIPTION OF THE DRAWINGS

The features of the invention deemed to be novel are defined in the appended claims. The invention itself, however, both as to organization and method of operation, together with further objects and advantages thereof, may be best understood with reference to the following description when read in conjunction with the accompanying drawings, in which:

FIG. 2 is a detailed cross-sectional and partially cut away view of a portion of the package of FIG. 1 with some portions indicated schematically therein.

DETAILED DESCRIPTION OF THE INVENTION

Figure 1:
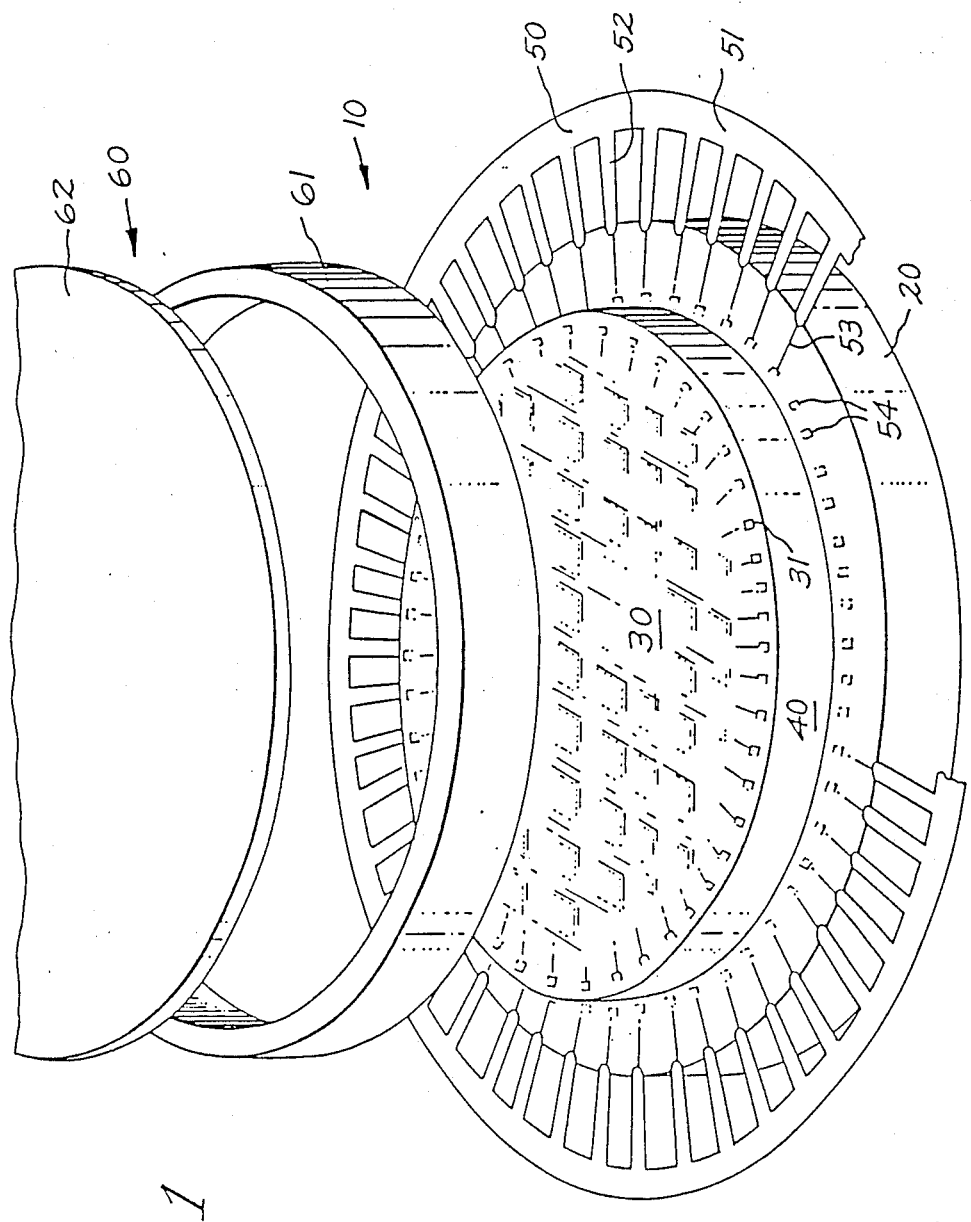
FIG. 1 is a three-dimensional view partially exploded and partially cut away of an exemplary integrated circuit chip package of the present invention.

Referring now to the drawings, and particularly to FIG. 1, there is shown an exploded, three dimensional view, partially cut away of the preferred embodiment of the integrated circuit chip package 10 of the invention. The package 10 comprises a substrate 20, a chip-holding frame 40, a conductive lead frame 50 (shown partly cut away at the front thereof in FIG. 1), and a cover 60 including a ring 61 and a lid element 62. For purposes of illustration the ring 61 and lid 62 are shown separated from the remainder of the package 10 in FIG. 1. A plurality of integrated circuit chips 30 are mounted in the frame 40 with the signal level input and output data being supplied to and from the chips via a series of terminal 45 mounted on the peripheral portion of the upper surface of the frame 40, as will be explained in greater detail hereafter. All electrical input and output signals to the integrated circuit chip package move through the lead frame 50 comprising an outer circular hub 51 from which a plurality of interiorly, radially directed leads 52 extend. Extending inwardly from each of the leads 52 is a wire 53 or other appropriate conductive line which is terminated in a contact pad 54, the contact pads 54 being located on the upper surface of the substrate member 20 just beyond the outer periphery of the frame 40. When fully assembled, the chip holding frame 40 is secured to the top surface of the substrate 20 and the ring 61 which has a diameter greater than that of the frame 40 is also secured to the top surface of the substrate 20 spaced outwardly from the frame, the wires 53 of the lead frame 50 passing underneath the bottom of the ring 61 when it is secured in place. The lid 62 completes an environmentally secure enclosure for the chip holding frame 40 by attachment to the top of the ring 61.

When assembled the package 10 must provide for electrical communication between the set of chips 30 and the outside world via the lead frame 50. Such communication requires that at least three groups of electrical connections be provided to the chips, these groups being discrete signal, power, and ground connections. The package 10 is essentially concerned with a novel structure for providing such communication of signals to and among the chips 30 themselves and between the chips 30 and the outside world via the interconnection system of package 10. In addition to providing for the coupling of appropriate electrical potentials to the chips, the package 10 provides a hermetically sealed environment for the chips and a thermally stable housing with substantially identical coefficients of thermal expansion for each of the major elements thereof to avoid structural damage during thermal cycles.

The substrate 20 not only provides a mechanical support for the frame 40, but also serves to perform the dual functions of removing thermal energy from the package and housing conductive layers for interconnecting both power and ground potentials to the various chips 30. For this purpose, and referring in particular to FIG. 2, the substrate 20 is seen to generally comprise a low loss, multilayer metallization, silicon printed wiring board. A planar insulating silicon cylindrical disk or wafer 21 forms the bottom layer of the substrate 20. The silicon wafer is selected to be anywhere from 2 to 15 or more mils thick, highly polished on one side thereof and of the type normally used for active semiconductor device fabrication. The wafer 21 is oxidized over its entire surface to a thickness of approximately 1 micron or more. A Pyrex glass film 22 is located on top of the polished surface of the wafer 21. A first refractory thick metal film 23 which has been preferably patterned into a grid formation is deposited onto the Pyrex glass film 22. This conductive layer 23 will serve as an interconnection system for providing a system ground potential to the package 10. The conductive layer 23 is stopped short of the periphery of the substrate 20 in order to prevent electrical shorts by contact with the outer surfaces of the substrate. A second Pyrex glass film is layered over the conductive film 23 in a similar fashion to the Pyrex glass layer 22 and a second patterned conductive thick film 25 is deposited on the Pyrex glass layer 24. This latter conductive film 25 will serve to provide power connections to the system contained in the package 10 as will be explained in greater detail hereinafter. The conductor layer 25 is terminated short of the periphery of the substrate 20 and, in addition, is patterned in a manner not to intersect with conductive feedthroughs which interconnect with the ground conductor layer 23, as can be seen at areas 28 in FIG. 2. A final upper insulating Pyrex glass layer 26 covers the conductdor layer 25.

Two sets of electrical feedthroughs or vias are provided in the substrate 20. A first set of vias 32 electrically interconnects a set of contacts 31 on the upper surface of the substrate 20 with the bottom ground conductor layer 23. A second set 35 of vias electrically interconnects a second set of contacts 34 on the upper surface of the substrate 20 with the uppermost conductive or power conductive layer 25 within the substrate. Selected ones of the pads 54 associated with the lead frame 50 also make contact between each of the sets of contacts 31 and 34 in order to provide electrical connections between the lead frame 50 and each of the power and ground conductive layers in the substrate 20. More specifically, as seen in FIG. 2, the wire 53g provides electrical contact between one of the leads 52g on the lead frame 50 and the conductive layer 23 by way of a pad 54g a via 32. In a similar manner, another of the wires 53p provides an interconnection between another of the leads 52p on the lead frame 50 and the power conductive layer 25 via another pad 54 and a via 35. It can thus be seen that preselected voltages are brought into the package via the lead frame 50 on specified leads to provide power and system ground potentials to the conductive layers 23 and 25 in the substrate 20 and thence to the various terminals of the chips 30, as will be explained in greater detail hereinafter.

The chip holding frame 40 is made of the same silicon material from which the substrate 21 is made, but is formed to have a diameter slightly smaller than the substrate. The frame 40 includes a series of relatively large apertures or openings 42, FIG. 2, which run the entire thickness of the frame 40 in which the integrated circuit chips 30 are mounted, as will be explained in greater detail hereinafter. In addition, the frame 40 is provided with a series of relatively smaller holes 44 which register with the vias 32 and 35 provided in the substrate 20, as discussed previously. The holes 44 are filled with conductive material to form feedthroughs 47, each feedthrough including either an upper contact 45 or 46. The contact set 45 lies approximately in the plane of the upper surface of the frame 40 and is located to directly overlie or register with the contact 34, which, in turn, connects electrically with the power conductive layer 25 in the substrate. In a similar manner, the set of contacts 46 also terminates approximately in the upper plane of the frame 40 and is located to electrically interconnect with contacts 31 in the substrate 20 which, in turn, are coupled to the ground conductive layer 23 in the substrate. Thus, there is formed by virtue of the registering conductive feedthroughs in the substrate and the frame two sets of interconnections, a first which couples power from a specific lead such as 52p on the lead frame 50 to an associated pad 54 on the upper surface of the substrate 20 and from there makes electrical connection to the power plane 25 of the substrate by way of via 32. From there the potential on the power conductive layer 25 is coupled, in accordance with a predesigned layout, to each of the chips 30 via registering feedthroughs 35 and 44 in the substrate and the frame respectively, terminating at a set of contacts 45 in the upper surface of the frame 40. A suitable wire bond or other connection is made between contact 45 and a pad on one of the chips, as will be described in greater detail below. In a similar manner, system ground potential is conducted via lead 52g and wire 53g to a selected contact 54g on the upper surface of the substrate 20 and from there down to the ground plane or ground conductive layer 23 in the substrate which, in turn, is connected via other feedthroughs 32 and registering feedthroughs and contacts 44 and 46, respectively, to the upper surface of the frame 40 and from there to a preselected pad 36 on a designated chip 30. As can be seen from the description thus far, the interconnection system of the invention enables both power and ground potentials to be coupled to the upper surface of the frame 40 adjacent each of the chips 30.

As is normal practice, the plurality of chips 30 housed on the frame 40 require generally three classes of connections in order to operate. The first two classes are the power and ground connections which, as previously explained, are provided to the chips via contact sets 45 and 46. A last class of interconnections must be made between and among the various chips 30. These interconnections between chips are at signal level and couple digital data among the various chips. These latter connections may be accomplished in various ways; a preferred method is by means of thin film conductive runs which are deposited as a patterned layer located above the chips 30. Such a method for providing chip interconnections is disclosed in the above referenced patent application Ser. No. 912,456. According to that technique, the various interconnections between the pads 36 on the chips 30 and the contact sets 45 and 46 to couple power and ground connection to the chips, and also the various connections between and among the chips are accomplished by first laying down a thin insulator film 55 which covers the upper surface of the frame 40 including the chips 30 and the contacts 45, 46 and 36. Next, holes are formed by a computer controlled laser drill or other means through the insulating layer 55 at those locations where interconnections are to be made to the various contacts and pads on the upper surface of the frame 40. A patterned conductive layer including conductive runs 58 is then formed on the surface of the insulating film 55 in accordance with conventional lithographic techniques, which fills the previously formed holes in the layer 55 and completes electrical connections as required between the various pads on the chips and contacts on the upper surface of the frame, as generally shown in FIG. 2. In this manner, all of the interconnections for the chip set to be assembled into a functioning integral unit are made. Various other techniques may be utilized for accomplishing such connections. The first and most obvious would be to wire bond the chips to each other as required in order to accomplish the functional objectives of the chip set.

Assembly of the package 10 of the invention is accomplished in two phases, a high temperature phase and a low temperature phase. The silicon wafer 21 which is of a type normally used for active device processing and having a diameter appropriate for the selected use is highly polished on one side and then oxidized to 1 micron or more thickness by use of conventional means. The first Pyrex glass insulating film 22 is next sputtered or screened onto the previously prepared silicon disk and fired on the polished surface. The refractory metal film 23, preferably tungsten or molybdenum, is now deposited by sputtering or thick film techniques (screening and firing). The conductive layer 23 may be continuous or patterned in accordance with the needs of the design. If sputtered and if a pattern of grid lines is required, these grid lines may be defined by conventional photolithography techniques. Layer 23, whether it be continuous or in the form of a grid form, terminates short of the peripheral edge of the wafer 20, as shown in FIG. 2. Appropriate vias will be formed as explained in greater detail hereinafter, to house vertically directed electrical connections between this layer and the top exterior surface of the substrate 20 so as to facilitate electrical coupling to this layer via contacts 54 which are near the edge of the wafer. A second layer of Pyrex glass insulator 24 and a second layer of refractory metal film 25 are then deposited in a manner similar to the previous two layers. Some of the conductive lines of the layer 25 are also terminated near the edge of the wafer to enable feedthroughs to be connected thereto. It should be noted again at this point that if the upper conductive layer 25 is continuous, it must provide for openings in order to isolate it from the conductive feedthroughs 32.

Holes for the feedthroughs 32 and 35 are accomplished by any suitable process, such as etching or laser drilling as described in the above noted U.S. Pat. No. 4,541,035. Conductive material is filled into the holes to complete the feedthroughs and terminating contacts 34, 35 and 54, also in accordance with known techniques.

The lead frame 50 is now supported as shown in FIG. 2 on the upper surface of the substrate 20 and the Pyrex glass sealing ring 61 is located over the interconnecting wires 53 of the lead frame, then fired onto the upper surface of the wafer 20 in a manner which leaves short lengths of the wires 53 both inside and outside of the ring 61 as shown in FIG. 2. The exposed refractory metal conductors are now electroplated with gold to increase conductivity, protect against corrosion and provide solderability.

Alternatively, the insulating layers 26, 24 and 22 may be made of polyimide, but this would require that these layers be deposited after the sealing ring 61 has been fired in place. Also, while thick film conductive materials such as tungsten and molybdenum are preferred, other materials including precious metal thick films or nickel thick film may be used. The upper surface of the ring 61 is provided with a solderable metallization such as a thick gold film for later use in attaching the lid 62. The above steps complete the high temperature phase of the assembly process.

The silicon frame 40 is next separately prepared by laser drilling of the relatively larger openings 42 and the relatively smaller holes for the feedthroughs 44. The openings 42 provide locations for the chips 30 which are to be mounted in the frame 40. The holes for the feedthroughs 44 have a conical shape which is an inherent result of laser drilling.

The silicon frame is then oxidized for isolation, aligned above the previously prepared silicon substrate 20, and glued in place onto the top surface of substrate 20 with the chips 30 in place in the openings 42. In bringing the frame 40 into alignment, care is taken to properly register the feedthroughs 32 and 35 with associated holes for the feedthroughs 44 in the frame. The polyimide is now cured and the lead frame 50 is attached in place as shown in FIG. 2 using 280° C. solder such as Au Sn or 92.5 Pb 5 Sn 2.5 Ag. After curing and suitably protecting the chips 30, the polyimide at the bottom of the relatively small holes is removed by plasma etching or laser drilling until the underlying metal is exposed. The hole for the feedthrough 44 are then metallized in a conventional manner and terminated in appropriately shaped contacts 45 and 46.

The pads on the chips 30 are now interconnected to each other and to the contacts 45 and 46 using a wire bonding system or an interconnect method as disclosed in aforementioned patent application Ser. No. 912,456. Other required electrical connections between the wires 53 and the contacts 54 are also completed as needed. The lid 62 is now soldered to the upper surface of the ring 61 which was previously metallized. However, only local heating is applied in this operation to avoid raising the rest of the assembly to an excessive, damage causing temperature. This is possible because Pyrex glass sealing isolates the lid thermally from the rest of the package.

While preferred embodiments of the present invention have been illustrated in detail, it is apparent that modifications and adaptations of those embodiments will occur to those skilled in the art. For example, while the major elements of the preferred embodiment are illustrated as being cylindrical in shape, other shapes may obviously be used. Therefore, it is to be expressly understood that such modifications and adaptations are within the spirit and scope of the present invention, as set forth in the following claims.

What is claimed is:

1. A semiconductor interconnection package comprising:
    a chip-holding frame having opposed, planar major surfaces, a plurality of holes extending through said frame between said major surfaces, said holes housing a power conducting feedthrough and a ground conducting feedthrough, each of said feedthroughs having opposed ends situated substantially flush with said major surfaces;
    a plurality of integrated circuit chips carried in openings within said frame, said chips having planar opposed major faces, one of said faces including terminal pads including ground and power pads; and
    a multilayer substrate supporting said chips, said substrate having an exterior flat surface to which said frame is attached and comprising an insulating wafer having a ground conductor layer, a power conductor layer, and an insulator layer deposited thereover and interposed between said frame and said wafer, said power and ground conductor layers separated from each other by said insulator layer, a first set of conductive vias for electrically coupling said ground conductor layer to said ground pads through said ground conducting feedthroughs, and a second set of conductor layer to said power pads through said power feedthroughs.

2. The combination recited in claim 1 wherein one of said major surfaces faces toward said substrate and the other of said major surfaces faces away from said substrate and wherein said chips include signal pads, said signal pads on different chips being interconnected via signal conductor means located on the side of said other major surface.

3. The combination recited in claim 2 wherein said signal pads are located substantially flush with said other major surface and further including a continuous thin insulating film deposited on said other major surface, and wherein said signal conductor means comprises a patterned conductive thin film layer carried on said insulating film.

4. The combination recited in claim 3 wherein said frame and said insulating wafer are made of silicon.

5. The combination recited in claim 4 wherein said insulating layer separating said ground and power conductor layers in said substrate is made of glass.

6. The combination recited in claim 2 further including a lead frame having ground and power leads, said ground and power leads coupled to said ground and power conductor layers in said substrate by selected ones of said ground and power vias, respectively, located near the periphery of said substrate.

7. The combination recited in claim 6 further including a cover supported from said substrate and circumscribing said chip-holding frame and passing over said other major surface to form a hermetic enclosure for said chip-holding frame.

8. The combination recited in claim 7 wherein said chip-holding frame, substrate, lead frame and cover each have a circular outer periphery, the outer diameter of said lead frame being larger than the outer diameter of said substrate, the outer diameter of said substrate being sufficiently larger than that of said chip-holding frame to provide a circular support band over which said cover is supported.

9. The combination recited in claim 8 wherein said cover comprises a cylindrical ring and a circular lid carried on said ring.

10. A chip mounting interconnection package comprising:
   a chip-holding frame adapted for mounting within openings therein a plurality of chips, each chip including power, ground and signal terminal pads;
   a multilayer substrate including an insulating wafer adapted to support said chips, said frame being attached to one of two major, planar surfaces of said substrate, said substrate including a ground conductive layer and a power conductive layer separated from each other by an insulation layer, said layers disposed intermediate said frame and said wafer;
   registering power and ground conductive feedthroughs in said frame and said substrate for coupling power and ground potentials from outside said package to said power and ground pads on said chips via said power and ground feedthroughs respectively; and
   signal interconnection means deposited on the surface of said frame opposite said substrate.

11. The combination recited in claim 10 wherein said frame and said wafer are made of silicon.

12. The combination recited in claim 11 wherein said insulation layer is made of glass.

13. The combination recited in claim 10 further including a lead frame having power and ground leads, said power and ground leads coupled to said power and ground conductor layers in said substrate.

14. The combination recited in claim 13 further including a cover supported from said substrate and circumscribing said chip-holding frame and passing over the other of said two major surfaces to form a hermetic enclosure for said chip-holding frame.

15. The combination recited in claim 14 wherein said chip-holding frame, substrate, lead frame and cover each have a circular outer periphery, the outer diameter of said lead frame being larger than the outer diameter of said substrate, the outer diameter of said substrate being sufficiently larger than that of said chip-holding frame to provide a circular support band over which said cover is supported.

* * * * *